(12) United States Patent
Dunn et al.

(10) Patent No.: US 6,349,456 B1
(45) Date of Patent: Feb. 26, 2002

(54) METHOD OF MANUFACTURING PHOTODEFINED INTEGRAL CAPACITOR WITH SELF-ALIGNED DIELECTRIC AND ELECTRODES

(75) Inventors: Gregory J. Dunn, Arlington Heights; Jovica Savic; Allyson Beuhler, both of Downers Grove; Min-Xian Zhang, Algonquin; Everett Simons, Palatine, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/224,338

(22) Filed: Dec. 31, 1998

(51) Int. Cl.[7] ................................................ H01G 7/00
(52) U.S. Cl. ......................... 29/25.42; 29/846; 29/852; 216/17; 216/18; 361/301.1; 361/303; 361/313
(58) Field of Search ....................... 29/852, 846, 25.42; 361/301.1, 303–305, 313, 327; 216/17, 18

(56) References Cited

U.S. PATENT DOCUMENTS

| | | | |
|---|---|---|---|
| 3,675,318 A | * 7/1972 | Merkenschlager | 29/852 |
| 4,554,229 A | * 11/1985 | Small, Jr. | 174/68.5 |
| 4,792,646 A | * 12/1988 | Enomoto | 29/852 X |
| 4,830,704 A | * 5/1989 | Voss et al. | 29/852 X |
| 4,870,751 A | * 10/1989 | Antoon | 29/852 X |
| 5,108,553 A | * 4/1992 | Foster et al. | 205/125 |
| 5,162,977 A | 11/1992 | Paurus et al. | |
| 5,172,304 A | 12/1992 | Ozawa et al. | |
| 5,347,712 A | * 9/1994 | Yasuda et al. | 29/852 |
| 5,716,663 A | * 2/1998 | Capote et al. | 427/96 |
| 5,774,327 A | 6/1998 | Park | 361/321.5 |
| 5,849,396 A | * 12/1998 | Ali et al. | 428/209 |
| 5,973,910 A | 10/1999 | Gardner | 361/313 |
| 6,085,415 A | * 7/2000 | Gandhi et al. | 29/852 |

* cited by examiner

Primary Examiner—Lee Young
Assistant Examiner—Rick Kiltae Chang
(74) Attorney, Agent, or Firm—Douglas D. Fekete

(57) ABSTRACT

A method for manufacturing a microelectronic assembly to have aligned conductive regions and dielectric regions with desirable processing and dimensional characteristics. The invention is particularly useful for producing integral capacitors, with the desired processing and dimensional characteristics achieved with the invention yielding predictable electrical characteristics for the capacitors. The method generally entails providing a substrate with a first conductive layer, forming a dielectric layer on the first conductive layer, and then forming a second conductive layer on the dielectric layer. A first region of the second conductive layer is then removed to expose a first region of the dielectric layer, which in turn is removed to expose a first region of the first conductive layer that is also removed. From this process, the first regions of the conductive and dielectric layers are each removed by using the overlying layer or layers as a mask, so that the remaining second regions of these layers are coextensive.

14 Claims, 2 Drawing Sheets

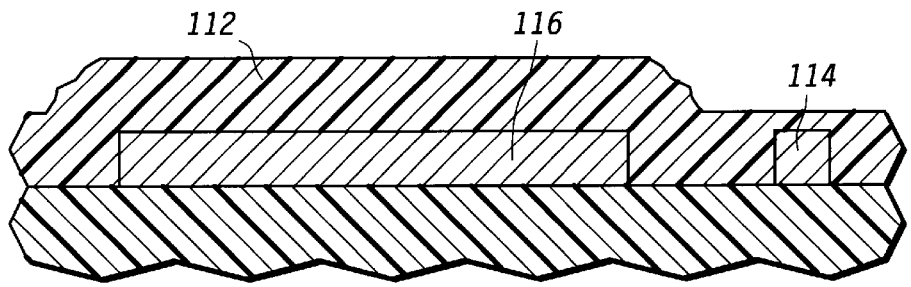
*FIG.1* —PRIOR ART—
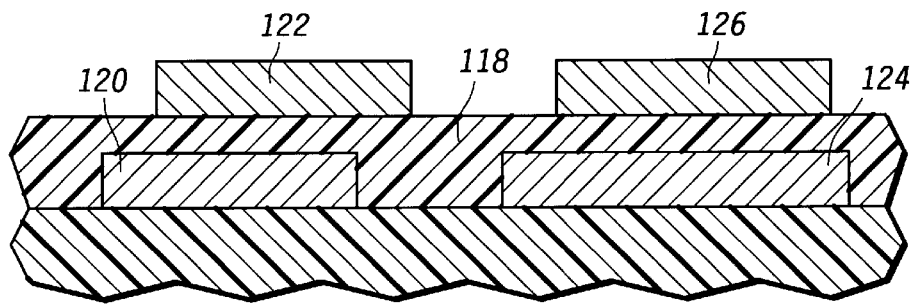
*FIG.2* —PRIOR ART—
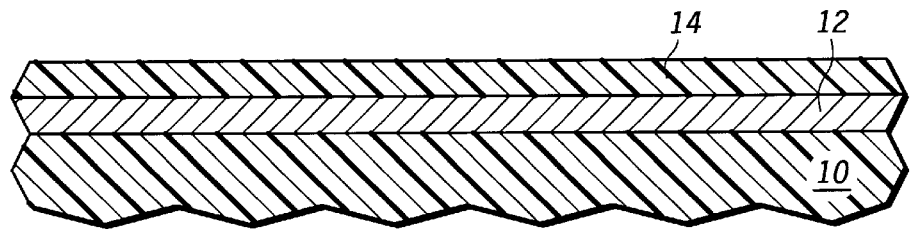
*FIG.3*
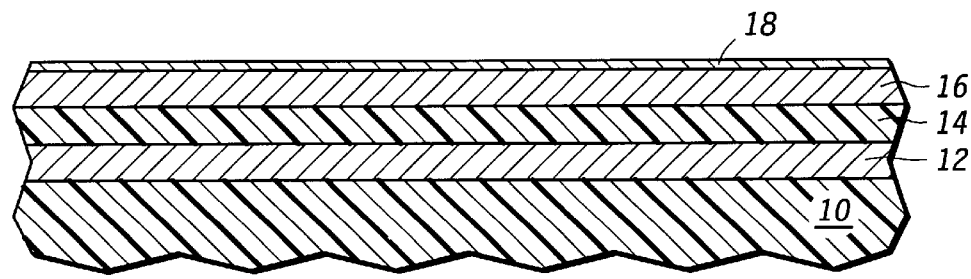
*FIG.4*

METHOD OF MANUFACTURING PHOTODEFINED INTEGRAL CAPACITOR WITH SELF-ALIGNED DIELECTRIC AND ELECTRODES

This invention was made with Government support under Agreement No. F33615-96-2-1838 awarded by DARPA. The Government has certain rights in the invention.

BACKGROUND OF THE INVENTION

1. Field of the Invention

The present invention generally relates to electrical circuits and their fabrication. More particularly, this invention relates to a process for forming a microelectronic assembly with photodefined integral capacitors having self-aligned dielectric and electrodes.

2. Description of the Prior Art

Integral capacitors for hybrid microelectronic circuits are typically fabricated by forming and patterning a conductive region on a substrate to define a bottom electrode, depositing a thin (20 to 50-micrometer) layer of dielectric material on the substrate and over the bottom electrode to form a capacitor dielectric, and then plating or otherwise metallizing the dielectric to form a second conductive region that is etched or otherwise patterned to define a top electrode. As is well known, the capacitance of an integral capacitor is given by $$C = K\varepsilon A / t$$

where $K$ is the dielectric constant or relative permittivity of the dielectric material, $\varepsilon$ is the permittivity of free space (a physical constant), $A$ is the area of the capacitor (that is, the area by which the top electrode overlaps the bottom electrode), and $t$ is the thickness of the dielectric.

From the above equation, a high dielectric constant and a small dielectric thickness are desirable to achieve a high capacitance per unit area. However, each of these approaches presents difficulties. It is well known that the dielectric constant of polymer materials (typically less than four) can be increased by filling the polymer with ceramic particles, fibers or platelets, e.g., barium titanate or lead titanate-doped lead magnesium niobate. Employing such a high permittivity dielectric, however, requires a departure from typical multilayer circuit constructions. Though often done (and as represented in FIGS. 1 and 2 by dielectric layers identified by reference numbers 112 and 118), it is generally undesirable to have the dielectric material that forms the capacitor dielectric present on other regions of a circuit board because the dielectric ceramic filler increases parasitic capacitance between other circuit features. A second difficulty presented by ceramic-filled resins, especially at high ceramic volume fills (e.g., about 30 to 60%) is that they cannot be electroplated as easily as pure resins for the formation of capacitor top electrodes.

Additional difficulties arise when the dielectric thickness is reduced. The thickness of a dielectric layer over features (e.g., capacitor electrodes) on a circuit board can be difficult to control because dielectric thickness is strongly influenced by the dimensions of the patterned features over which the dielectric is deposited. As can be seen from FIG. 1, a dielectric layer 112 tends to planarize well over a narrow feature (e.g., electrode) 114, but poorly over large features 116, with the result that dielectric thickness can vary between adjacent capacitors and possibly within a single capacitor electrode. This causes two problems. First, there is a danger of metal-to-metal shorts through the very thin dielectric covering the narrow feature 114. Second, desirable tolerances for capacitor values, e.g., less than 10%, are difficult to achieve for integral capacitors on a circuit board that requires a wide range of capacitor values and hence electrode sizes.

Another difficulty in achieving acceptable capacitor tolerances arises as a result of the difficulty of aligning the capacitor electrodes relative to each other. As illustrated in FIG. 2, even if a uniform thickness for a capacitor dielectric 118 can be achieved, there is a tendency for electrode misalignment, as represented by the bottom electrode 120 and top electrode 122. Such misalignment alters the capacitance through reduction of the capacitor area ("A" in the capacitance equation above). As a partial solution, the prior art has resorted to making one of the electrodes (e.g., the bottom electrode 124 of FIG. 2) larger than the other (e.g., the top electrode 126 of FIG. 2) to prevent electrode misalignment that would reduce the effective capacitor value.

Accordingly, it would be desirable if a method were available for forming integral capacitors that produced capacitor dielectrics of uniform thickness and well-aligned electrodes in order to promote high capacitance density, capacitor tolerances of less than 10%, and reduced risk of interlayer shorts.

SUMMARY OF THE INVENTION

The present invention provides a method for manufacturing a microelectronic assembly to have aligned conductive and dielectric regions with desirable processing and dimensional characteristics. The invention is particularly useful for producing integral capacitors, with the desired processing and dimensional characteristics achieved with the invention yielding predictable electrical characteristics for the capacitors.

The method of this invention generally entails providing a substrate with a first conductive layer, forming a dielectric layer on the first conductive layer, and then forming a second conductive layer on the dielectric layer. A first region of the second conductive layer is then removed to expose a first region of the dielectric layer, which in turn is removed to expose a first region of the first conductive layer that is also removed. From this process, a second region of the first conductive layer remains, which is covered by a second region of the dielectric layer, which in turn is covered by a second region of the second conductive layer. According to this invention, the first regions of the conductive and dielectric layers are each removed by using the overlying layer or layers as a mask, so that the remaining second regions of these layers are coextensive, i.e., their perimeters are accurately aligned with each other. The resulting structure can define a capacitor, in which the second regions of the first and second conductive layers define capacitor electrodes and the second region of the dielectric layer defines a capacitor dielectric between the capacitor electrodes.

According to this invention, the first regions of the conductive and dielectric layers are preferably removed by etching the conductive layers and photodefining the dielectric layer. For the latter, the dielectric layer is preferably formed of a positive-acting photosensitive dielectric material, and the first region of the dielectric layer is removed by using the second region of the second conductive layer as a photomask. Also preferred is that the second conductive layer is a metal foil that can be laminated directly to the dielectric layer, as opposed to being plated or otherwise deposited.

In view of the above, this invention makes possible integral capacitors with self-aligned dielectric and electrodes, so that multiple capacitors can be formed on a microelectronic assembly, each being patterned to accurately obtain desired capacitances by the ability to form dielectrics of uniform thickness between aligned electrodes. In particular, alignment between conductive and dielectric layers is achieved by defining each layer using its overlying layer (or layers) as a mask, while uniform thickness of the dielectric is achieved as a result of the dielectric being deposited on the first conductive layer while still unpatterned. The invention also eliminates the need to roughen and plate the dielectric for the top electrode, so that the ceramic content of the dielectric is not an issue in terms of adhesion between the top electrode and the dielectric. The invention further enables the use of high-k ceramics in the dielectric without increasing parasitic capacitance because the dielectric containing the high-k ceramic can be precisely limited to the capacitor. As a result, interconnect lines can be formed closely adjacent to the capacitor electrodes.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing, in which:

FIGS. 1 and 2 are cross-sectional views showing integral capacitor structures in accordance with the prior art; and FIGS. 3 through 8 are cross-sectional views showing process steps for forming integral capacitors with self-aligned electrodes in accordance with this invention.

DETAILED DESCRIPTION OF THE PREFERRED EMBODIMENT

Figure 5:
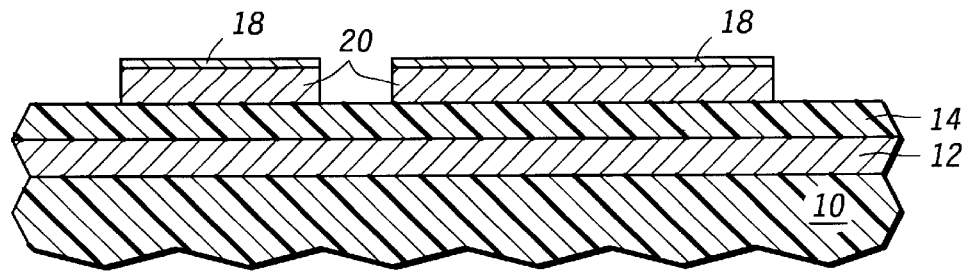
Figure 6:
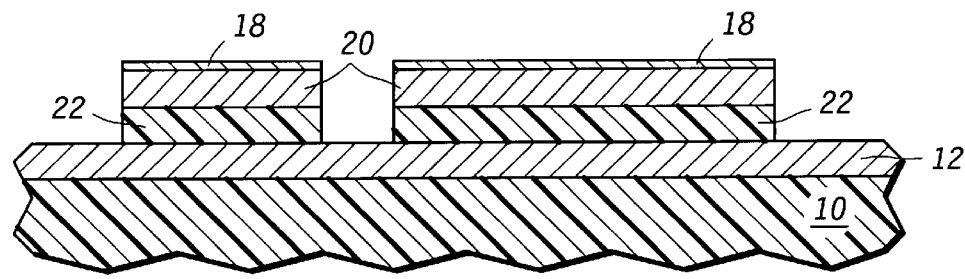
Figure 7:
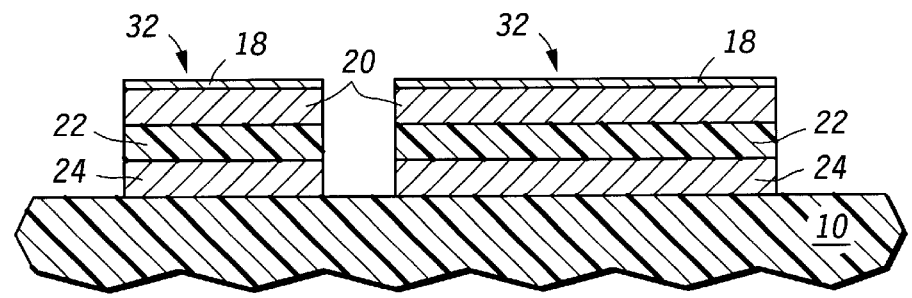
Figure 8:
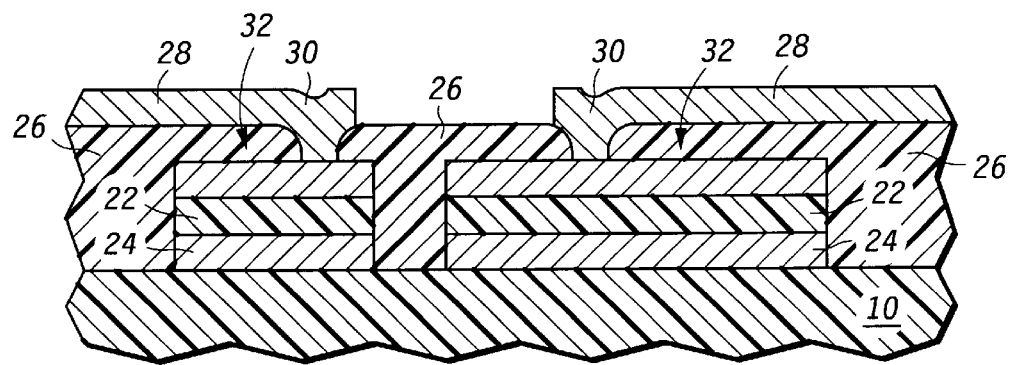

A process for forming integral capacitors on a multilayer microelectronic circuit board in accordance with this invention is represented in FIGS. 3 through 8. As shown in FIGS. 7 and 8, a pair of capacitors 32 are fabricated, though any number of capacitors can be simultaneously formed within any given layer of a multilayer circuit in accordance with this invention. As will become apparent from the following description, accurate physical alignment and dimensions are achieved for integral capacitor dielectrics and electrodes with this invention, such that integral capacitors can be fabricated to have accurately controlled capacitance values. While a particular configuration for the capacitors 32 is shown in FIG. 8, those skilled in the art will appreciate that variations and modifications are possible, and such variations and modifications are within the scope of this invention.

Referring to FIG. 3, the circuit board is shown as having a substrate 10 on which a conductor layer 12 and a dielectric layer 14 have been formed. The substrate 10 can be any suitable material, including a printed wiring board (PWB), a flexible circuit, a ceramic or silicon substrate, or another dielectric layer of a multilayer circuit, though other suitable substrates and materials could also be used. Because the conductor layer 12 will be patterned to formed bottom electrodes 24 for the capacitors 32 shown in FIGS. 7 and 8, the conductor layer 12 is preferably planar copper deposited on the substrate 10 by plating or by lamination of a copper foil, though it is foreseeable that the conductor layer 12 could be formed by different methods and with different materials. A suitable thickness for the conductor layer 12 is about five to about fifty micrometers.

The dielectric layer 14 is preferably formed of a positive-acting thermally-curable photoresist material, such that known photoimaging and development techniques can be employed to pattern the dielectric layer 14. Particles of various ceramic materials can be dispersed in the polymer dielectric layer 14, with lead magnesium niobate, lead titanate and/or barium titanate being preferred. A suitable particle size for the ceramic is about 0.2 to 5 micrometers. Suitable thick-film polymer compositions for the dielectric layer 14 include a resin, photosensitive agents and hardeners. The resin component can be any suitable liquid resin or solid resin, so as to enable the resin mixture to be readily deposited onto the surface of the conductor layer 12 in liquid form or as a laminate to form the dielectric layer 14. Resins that could be used include thermoplastic resins, thermosetting resins, elastomers and mixtures thereof, which when incorporated with a photosensitive material yield a photoimageable composition. Desirable properties for the thick-film polymer include physical properties that remain stable throughout deposition and photoimaging of the dielectric layer 14. According to this invention, the dielectric layer 14 serves as a permanent dielectric layer of the circuit structure, such that the dielectric properties of the thick-film polymer also preferably remain stable throughout the deposition and photoimaging processes.

For the above reasons, epoxies are particularly suitable as the resin for the dielectric layer 14, with a preferred epoxy-base composition being commercially available from Ciba-Geigy under the name PROBELEC®. PROBELEC is a liquid resin that can be coated onto the conductor 12 to yield a dielectric layer 14 of uniform thickness (preferably about ten to about forty micrometers), particularly since the conductor layer 12 is unpatterned at this point in the fabrication process. An advantage of positive-acting photosensitive materials such as the positive version of PROBELEC is that they are typically more photosensitive than negative-acting photosensitive materials, allowing acceptable photospeeds at high ceramic volume fills. Another advantage of positive-acting photosensitive materials over negative-acting materials is reduced pinholes due to shadowing from dust particles during exposure.

Due to the presence of photosensitive agents, selective exposure of the dielectric layer 14 to appropriate electromagnetic radiation can be performed to precisely photochemically pattern the dielectric layer 14. Regions of the dielectric layer 14 exposed to electromagnetic radiation become relatively soluble to certain developers, while unexposed regions of the dielectric layer 14 remain relatively insoluble. After exposure, preferred positive-acting thermally-curable photoresist materials are partially cured. A suitable treatment for partially curing the dielectric layer 14 when formed of the PROBELEC material is a temperature of about 110 C. maintained for about sixty minutes. Following deposition, exposure and partial curing of the dielectric layer 14, a laminate copper foil 16 is applied to the surface of the dielectric layer 14, as shown in FIG. 4, which will subsequently be patterned to form the top electrodes 20 shown in FIG. 8. The foil 16 preferably includes a sacrificial layer 18 capable of protecting the copper foil 16 during a subsequent etch step to be described below. The sacrificial layer 18 is preferably tin, and can be plated onto the foil 16 before or after laminating the foil 16 to the dielectric layer 14. A preferred thickness for the copper foil 16 is about ten to about fifty micrometers, and a preferred thickness for the sacrificial layer 18 is about five to about ten micrometers to provide adequate protection to the foil 16.

FIG. 5 represents the result of etching the foil 16 to define the top electrodes 20. Etching of the foil 16 first requires application and patterning of a temporary photoresist, and then wet etching of the sacrificial layer 18 and the foil 16. The etchant used to remove the exposed portions of the foil 16 must not attack the underlying dielectric layer 14. Cupric chloride will etch both the tin sacrificial layer 18 and the copper foil 16; alternatively, ammonium bifluoride can be used for the tin sacrificial layer 18 and ammonium hydroxide for the copper foil 16. It is foreseeable that other etchants could be used. From FIG. 5, it can be seen that the electrodes 20 cover two limited regions of the dielectric layer 14 while exposing the remainder of the layer 14. Due to the presence of photosensitive agents in the dielectric layer 14, exposure of the dielectric layer 14 to appropriate electromagnetic radiation can be performed using the electrodes 20 as photomasks to precisely photochemically pattern the dielectric layer 14 to yield capacitor dielectrics 22 shown in FIG. 8. Because the dielectric layer 14 is formed of a positive-acting photosensitive material, irradiation at a frequency, propagational direction and intensity sufficient to activate the photosensitive characteristics of the dielectric layer 14 material yields a relatively more soluble state in the exposed regions of the dielectric layer 14, while the portions of the layer 14 covered by the electrodes 20 remain insoluble (polymerized). As represented in FIG. 6, the exposed regions of the dielectric layer 14 can then be removed by a suitable developer, e.g., gamma butylactone (GBL) if PRO-BELEC is used as the material for the dielectric layer 14, with the polymerized regions of the dielectric layer 14 remaining as a result of being relatively insoluble to the developer. As can be readily appreciated from this process, the electrodes 20 establish the widths and lengths of their respective underlying portions of the dielectric layer 14, and therefore the widths and lengths of the capacitor dielectrics 22.

FIG. 7 represents the result of a second etch step by which the dielectrics 22 serve as etch masks for the conductor layer 12, which as a result of this etch defines the bottom electrodes 24 of the capacitors 32. The conductor layer 12 is etched with a suitable etchant that attacks the layer 12 but not the sacrificial layer 18 protecting the foil 16, so that only those portions of the conductor layer 12 left exposed by the dielectrics 22 are removed during etching. For a conductor layer 12 and foil 16 formed of copper and a sacrificial layer 18 formed of tin, a suitable etchant for this step is ammonium hydroxide, which attacks copper but not tin. It is foreseeable that other etchants could be used. As again can be readily appreciated from this process, the widths and lengths of the bottom electrodes 24 are determined by their respective overlying dielectrics 22, which in turn were defined by the top electrodes 20. As a result, the capacitor electrodes 20 and 24 and dielectrics 22 are self-aligned, so that misalignment between the electrodes 20 and 24 is avoided.

Following the etch step shown in FIG. 7, the sacrificial layer 18 is stripped from the top electrodes 20, and build-up of the circuit continues. As portrayed in FIG. 8, a second photodefinable dielectric layer 26 can be applied and patterned over the capacitors 32, and metallization 28 formed that makes contact to the top electrodes 20 through vias 30 in the dielectric layer 26.

While our invention has been described in terms of particular embodiments, it is apparent that other forms could be adopted by one skilled in the art. For example, materials other than those noted could be used. Accordingly, the scope of our invention is to be limited only by the following claims.

What is claimed is:

1. A method of manufacturing a circuit board, the method comprising the steps of:
   providing a substrate with a first conductive layer having first and second regions;
   applying a dielectric layer to the first conductive layer, said dielectric layer composed of a positive-acting photosensitive material;
   applying a second conductive layer to the dielectric layer;
   removing a first region of the second conductive layer to expose a first region of the dielectric layer, a second region of the second conductive layer remaining and covering a second region of the dielectric layer;
   irradiating and developing the dielectric layer using the second region of the second conductive layer as a photomask to remove the first region of the dielectric layer to expose the first region of the first conductive layer and curing the second region of the dielectric layer; and
   removing the first region of the first conductive layer.

2. The method according to claim 1, wherein the step of removing the first region of the second conductive layer is an etching step.

3. The method according to claim 1, wherein the step of removing the first region of the first conductive layer is an etching step that employs the second region of the dielectric layer as a mask.

4. The method according to claim 1, wherein the second conductive layer is a metal foil comprising a copper layer and a tin layer.

5. The method according to claim 4, wherein the step of applying the second conductive layer to the dielectric layer comprises laminating the copper layer to the dielectric layer, and then plating the tin layer on the copper layer.

6. The method according to claim 4, wherein the step of applying the second conductive layer to the dielectric layer comprises plating the tin layer on the copper layer to form the metal foil, and then laminating the metal foil to the dielectric layer to form the second conductive layer.

7. The method according to claim 4, further comprising a step of removing the tin layer after the step of removing the first region of the first conductive layer.

8. The method according to claim 1, further comprising steps of:
   forming a second dielectric layer that covers and surrounds the second regions of the first conductive layer, the dielectric layer and the second conductive layer; and then
   forming a contact to the second region of the second conductive layer through the second dielectric layer.

9. The method according to claim 1, wherein the positive-acting photosensitive material contains a dispersion of ceramic particles.

10. The method according to claim 9, wherein the ceramic particles are formed from at least one material selected from the group consisting of lead magnesium niobate, lead titanate and barium titanate.

11. The method according to claim 1, wherein the step of removing the first region of the dielectric layer is accomplished by selectively exposing the first region of the dielectric layer to electromagnetic radiation at a frequency, a propagational direction and an intensity sufficient to activate photosensitive characteristics of the dielectric material thereby yielding a soluble state in the first region of the dielectric layer and an insoluble state in the second region of the dielectric layer.

12. The method according to claim 1, wherein the second regions of the first and second conductive layers define first and second capacitor electrodes, respectively, and the second region of the dielectric layer defines a capacitor dielectric between the first and second capacitor electrodes.

13. A method of manufacturing a circuit board, the method comprising the steps of:

provideing a substrate with a copper layer having first and second regions;

applying a positive-acting photosensitive dielectric material to the first and second regions of the copper layer to form a dielectric layer thereon, the photosensitive dielectric material containing ceramic particles in an epoxy-base matrix;

laminating to the dielectric layer a copper foil having a sacrificial layer;

etching a first region of the copper foil through the sacrificial layer to expose a first region of the dielectric layer, a remaining portion of the sacrificial layer and a second region of the copper foil remaining and covering a second region of the dielectric layer;

exposing and developing the first region of the dielectric layer using the remaining portion of the sacrificial layer and the second region of the copper foil as a photomask, the first region of the dielectric layer being removed to expose the first region of the copper layer, the second region of the dielectric layer remaining and covering the second region of the copper layer;

removing the first region of the copper layer using the second region of the dielectric layer as an etch mask so that the second regions of the copper layer, the dielectric layer, and the copper foil are coextensive;

removing the remaining portion of the sacrificial layer from the copper foil;

forming a second dielectric layer that covers and surrounds the second regions of the copper layer, the dielectric layer and the copper foil; and then forming a contact to the copper foil through the second dielectric layer.

14. The method according to claim 13, wherein the second regions of the copper foil and the copper layer define first and second capacitor electrodes, respectively, and the second region of the dielectric layer defines a capacitor dielectric between the first and second capacitor electrodes.

* * * * *